(12) United States Patent
Mühlhause et al.

(10) Patent No.: US 10,287,678 B2
(45) Date of Patent: May 14, 2019

(54) METHOD AND DEVICE FOR CONTINUOUSLY SUPPLYING A PRECURSOR

(71) Applicants: ThyssenKrupp Steel Europe AG, Duisburg (DE); ThyssenKrupp AG, Essen (DE)

(72) Inventors: Walter Mühlhause, Geldern (DE); Michael Strack, Recklinghausen (DE)

(73) Assignees: ThyssenKrupp Steel Europe AG, Duisburg (DE); ThyssenKrupp AG, Essen (DE)

( * ) Notice: Subject to any disclaimer, the term of this patent is extended or adjusted under 35 U.S.C. 154(b) by 264 days.

(21) Appl. No.: 15/307,978

(22) PCT Filed: Apr. 17, 2015

(86) PCT No.: PCT/EP2015/058432
§ 371 (c)(1),
(2) Date: Oct. 31, 2016

(87) PCT Pub. No.: WO2015/165758
PCT Pub. Date: Nov. 5, 2015

(65) Prior Publication Data
US 2017/0058400 A1    Mar. 2, 2017

(30) Foreign Application Priority Data
Apr. 30, 2014 (DE) .................. 10 2014 106 129

(51) Int. Cl.
*C23C 16/448* (2006.01)
*B01D 1/00* (2006.01)
(Continued)

(52) U.S. Cl.
CPC ........ *C23C 16/4481* (2013.01); *B01D 1/0082* (2013.01); *C23C 14/246* (2013.01);
(Continued)

(58) Field of Classification Search
CPC . C23C 16/50; C23C 16/4481; C23C 16/4486; C23C 16/54–545; B01D 1/0082; B01D 1/0076
(Continued)

(56) References Cited
U.S. PATENT DOCUMENTS 5,330,072 A    7/1994 Ferri, Jr. et al.
5,950,693 A    9/1999 Noah et al.
(Continued)

FOREIGN PATENT DOCUMENTS

CN    1446269 A    10/2003
CN    2716285 Y    8/2005
(Continued)

OTHER PUBLICATIONS

Int'l Search Report for PCT/EP2015/058432 dated May 29, 2015 (dated Jun. 5, 2015).

*Primary Examiner* — Elizabeth A Burkhart
(74) *Attorney, Agent, or Firm* — Lathrop Gage L.L.P.

(57) ABSTRACT

A method and a device for coating may involve continuously supplying a precursor, in some cases at a constant precursor level, to a plurality of coating modules. As a result, a continuous coating operation is ensured. Moreover, one such method for supplying a precursor to a plurality of coating modules of a coating device may be employed where, for example, the coating modules have a pick-off device and a supply line, the supply line which may be configured as a riser at least in some regions. Precursor may be supplied by the supply line to the pick-off device of the coating module.

14 Claims, 3 Drawing Sheets

(51) Int. Cl.
*C23C 16/455* (2006.01)
*C23C 14/24* (2006.01)

(52) U.S. Cl.
CPC ........ *C23C 16/448* (2013.01); *C23C 16/4482* (2013.01); *C23C 16/45561* (2013.01)

(58) Field of Classification Search
USPC ........................................................ 427/569
See application file for complete search history.

(56) References Cited

U.S. PATENT DOCUMENTS

| | | |
|---|---|---|
| 2003/0037836 A1 | 2/2003 | Blatt et al. |
| 2012/0149182 A1 | 6/2012 | Rey Garcia |

FOREIGN PATENT DOCUMENTS

| | | | |
|---|---|---|---|
| CN | 103122457 A | | 5/2013 |
| CN | 203253420 U | | 10/2013 |
| DE | 112005001190 B | | 2/2014 |
| EP | 2345473 A2 | | 7/2011 |
| EP | 2636446 A1 | | 9/2013 |
| WO | WO 2005116290 | * | 12/2005 |

\* cited by examiner

METHOD AND DEVICE FOR CONTINUOUSLY SUPPLYING A PRECURSOR

CROSS REFERENCE TO RELATED APPLICATIONS

This application is a U.S. National Stage Entry of International Patent Application Serial Number PCT/EP2015/058432, filed Apr. 17, 2015, which claims priority to German Patent Application No. DE 10 2014 106 129.2 filed Apr. 30, 2014, the entire contents of both of which are incorporated herein by reference.

FIELD

The present disclosure relates to methods and devices for supplying precursors to coating modules.

BACKGROUND

In particular in the case of coating strips, especially metal strips or steel strips, for example using a bonding agent, very thin coatings which are applied by way of a plasma-coating method, for example, are required. A plasma-coating method enables very precise control of the layer thickness, and permits thinnest layers in the nano range to micrometer range to be applied. A plasma-coating device is known from the European patent application EP 2 636 446 A1, for example. By virtue of the plasma-guided coating process, only limited widths of a workpiece to be coated may be processed in the case of plasma coating. Moreover, the application rate is limited such that the strip speed for reaching a specific layer thickness is restricted in the case of coating such that measures for accelerating the coating output have to be taken. Therefore, plasma-coating devices often use a plurality of coating modules, for example more than 5 coating modules, which coat various part-areas of the workpieces to be coated in parallel and/or in series. In the case of coating, in particular in the case of plasma coating, a process gas is supplied to the coating module, and a precursor is injected by way of a pick-off device into the process gas. Herein, the precursor which is prevailing in the supply line of the coating module is entrained by the process gas, is atomized, and is guided together with the process gas onto the surface to be coated. The precursor is the primary material for producing the coating, for example for producing a bonding-agent coating, on the strip surface. To this end, the process gas and the precursor are introduced into the plasma, or into the afterglow of the plasma, respectively. The amount of precursor that is introduced into the process gas depends on the amount of the precursor that is entrained by the process gas in the pick-off device, and thus depends on the precursor level in the pick-off device, or in the supply line to the pick-off device, respectively. In order for continuous coating to be enabled, the precursor level in each pick-off device therefore has to be kept constant, and precursor simultaneously has to be supplied continuously in order for the coating process to be carried out as uniformly as possible.

To date, this issue has been addressed in that a dedicated storage container for the precursor is assigned to each pick-off device of a coating module, the filling of said storage container sufficing, for example, for a complete work shift. However, storing the precursor in a storage container that is assigned to a single coating module has the disadvantage that said storage container has to be individually refilled, this allowing the setting-up times in the case of a multiplicity of coating modules, for example of more than 5, to become excessive. If a plurality of coating modules are to be fed from one storage container, dissimilar line lengths to the coating module, caused by dissimilar flow resistances, lead to dissimilar amounts of precursor being provided such that issues exist in relation to the layer thickness which is applied per coating module. Therefore, identical flow resistances from the storage container up to the individual coating modules would have to be used, in principle. However, the coating device will then become extremely complex, in particular when high production capacities and thus high coating rates or strip speeds are being realized, respectively.

BRIEF DESCRIPTION OF THE FIGURES AND TABLES

DETAILED DESCRIPTION

Figure 1:
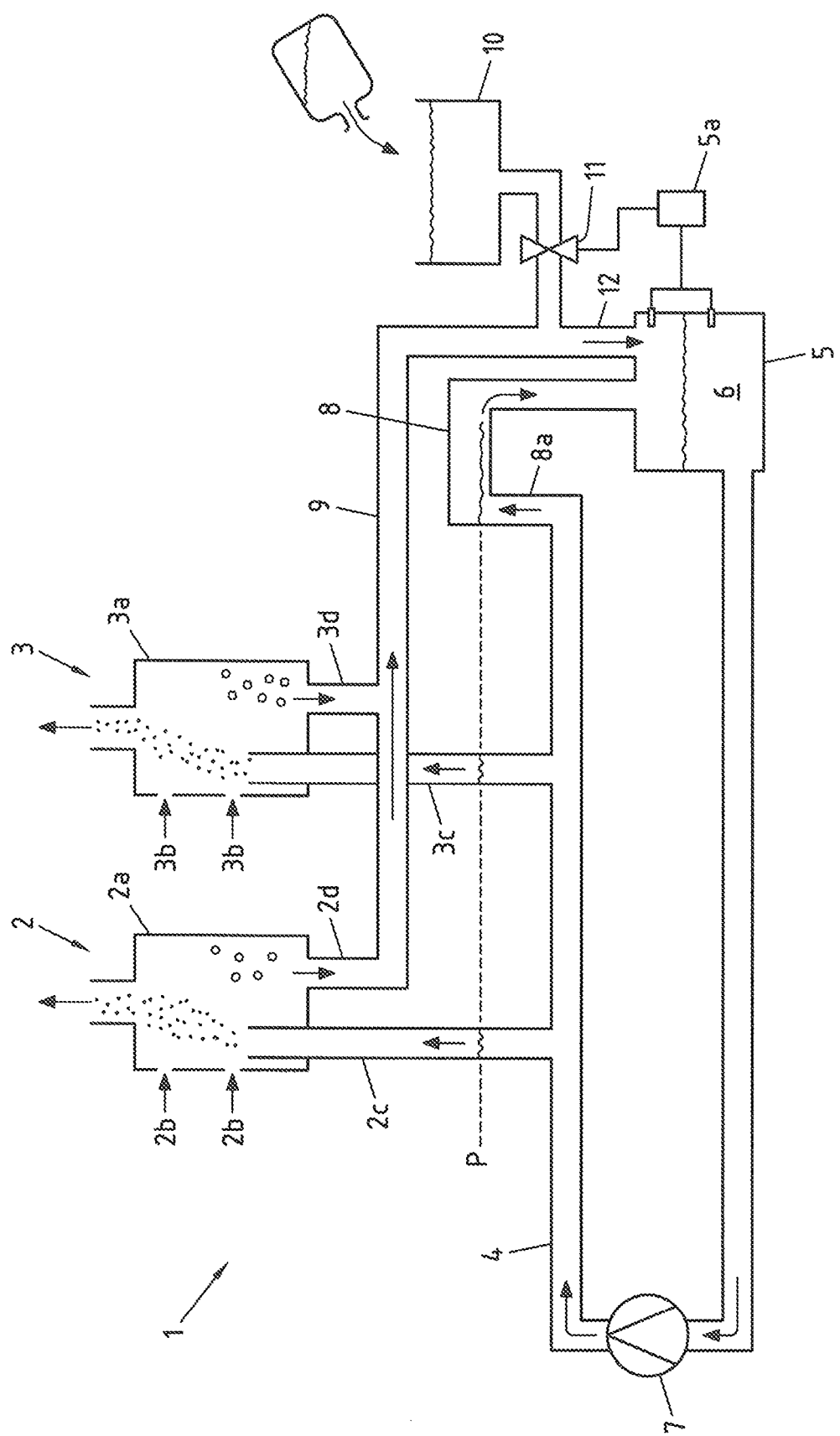
FIG. 1 is a schematic view of an example device having a ring line for a plurality of pick-off devices.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting 'a' element or 'an' element in the appended claims does not restrict those claims to articles, apparatuses, systems, methods, or the like having only one of that element.

The present disclosure generally concerns methods for supplying at least one precursor to a plurality of coating modules of a coating device, wherein the coating modules have at least one pick-off device and at least one supply line that in regions is configured as a riser, by way of which supply line the precursor is supplied to the pick-off device of the coating module. Further, the present disclosure generally concerns coating devices that have a plurality of coating modules and at least one storage container for a precursor. The coating modules may have at least one pick-off device and at least one supply line, which in regions is configured as a riser, to the pick-off device, by way of which supply line the precursor is supplied to the pick-off device of the coating module.

One example object of the present disclosure is to propose a method and a simple device for coating, by way of which a precursor may continuously and at an identical precursor level be provided to a plurality of coating modules and a continuous coating operation is guaranteed.

According to a first teaching of the present invention, the object stated is achieved by a method in that a precursor is supplied from a storage container by way of a ring line to at least one pick-off device, a larger amount of precursor than is necessary is supplied to the at least one pick-off device in the ring line, and the excess amount of precursor is fed back into the storage container, wherein during the recirculation of the precursor in the ring line a hydrostatic pressure is generated in each supply line of an individual pick-off device that is connected to the ring line.

It is possible by way of the method according to the invention for the precursor level to be established at a specific value and kept constant by way of the hydrostatic pressure of the precursor in each supply line connected to the storage container. In particular, the precursor level in the supply lines of one or of a plurality of pick-off devices then is no longer dependent on the filling height of the storage container, but only dependent on precursor being fed back to the storage container. Herein, the ring line is fed, for example, by a pump with precursor from the storage container. The level of the precursor remains constant despite the pick-off by the pick-off device, as long as precursor can be fed back again into the storage container. In this way, a plurality of pick-off devices may display identical precursor levels, for example, and a plurality of coating modules may be fed with the same amount of coating material in order for various part-areas of a strip, for example of a steel strip, to be coated in parallel and/or in sequence on account thereof. It has only to be guaranteed that the amount of precursor that is supplied to the individual pick-off devices is larger than the amount retrieved, so that the hydrostatic pressure in the supply lines may be built up.

According to a first embodiment of the method, the hydrostatic pressure in the supply lines of the pick-off devices is set in the ring line during the recirculation of the precursor into the storage container by way of a throttle valve, a flow restrictor, and/or an overflow that is connected to a riser. Throttle valves and flow restrictors enable a defined hydrostatic pressure in the ring line of the precursor to be built up by reducing the throughput of the amounts of precursor being fed back. The hydrostatic pressure is generated by the precursor rising in the riser of the overflow. The pressure can be set precisely by way of the height of the riser in comparison with the height of the supply lines. In the case of the overflow being used, pressure variations, for example by virtue of variations in the amount of precursor being supplied, have no effect or only a minor effect on the precursor level.

The generation of a constant precursor level in the supply lines of a plurality of pick-off devices is achieved in a particularly simple manner according to one exemplary embodiment in that the at least one precursor by way of the ring line is supplied to a plurality of supply lines of pick-off devices. An identical precursor pressure and thus an identical precursor level in the supply lines which in regions are configured as a riser is prevailing in all supply lines that are connected to the ring line by virtue of the hydrostatic or hydraulic pressure being generated in the recirculation of the precursor.

By way of a further embodiment of the method, at least one ring line feeds a storage reservoir which is connected to the pick-off device of a coating module, wherein the precursor level in the storage reservoir is set by way of the hydrostatic pressure in the supply line. By way of the storage reservoir, pressure variations in the supply lines have a reduced effect on the precursor level such that smaller variations arise in the coating process.

According to a further embodiment of the method, excess precursor from the pick-off device of the coating module is fed back to the storage container in a collecting line that is separate from the supply of the precursor, or in individual lines. Collection lines for the excess precursor simplify the construction of a coating device. However, it is also possible for the excess precursor to be fed back individually from each pick-off device into the storage container.

Preferably, according to a further embodiment of the method, the storage container upon reaching a minimum filling amount is automatically refilled, so that a continuous coating operation may be guaranteed in a simple manner. Self-evidently, it is also conceivable for the storage container to be manually filled once a minimum filling level has been reached.

The object stated above, according to a second teaching of the present invention, in the case of a coating device is achieved in that a plurality of pick-off devices are connected to a storage container of a precursor, each pick-off device by way of a single ring line, or a plurality of pick-off devices by way of a common ring line, for the recirculation of the excess precursor is/are connected to the storage container, means for supplying the precursor by way of the ring line to the at least one pick-off device are provided in the ring line or the ring lines, and means for generating a hydrostatic pressure in the supply lines of the at least one pick-off device are provided in the ring line in the region of the recirculation of the precursor into the storage container.

First, the precursor in the ring line, by way of the means for supplying the precursor by way of the ring line to the at least one pick-off device, for example a pump, is transported to the supply lines. The non-retrieved excess amount of precursor in the supply lines of the pick-off devices is fed back again to the storage container. The region of the recirculation of the precursor, when viewed in the flow direction of the precursor, commences after the last supply line of a pick-off device. A hydrostatic pressure in the direction opposite to that of the flow direction of the precursor in the ring line and thus also in each supply line, by way of which hydrostatic pressure the precursor level may be set independently of the filling level of the precursor in the storage container, is generated by the means for generating a hydrostatic pressure that are provided in the region of the recirculation of the precursor. The precursor level in the supply line or supply lines is always identical irrespective of the cross section or the line length of the supply lines, since the level depends only on the hydrostatic pressure in the ring line. Thus, a plurality of pick-off devices of a coating device may be supplied by way of the device according to the invention at an identical precursor level in the supply lines which are at least in regions configured as a riser. A continuous operation of the coating plant may then be guaranteed by refilling the storage container.

According to a first embodiment of the coating device, throttle valves, flow restrictors, and/or an overflow that is connected to a riser are/is provided in the region of the recirculation of the ring line as means for providing the hydrostatic pressure in the supply lines of the pick-off devices. The hydrostatic pressure in the recirculation of the precursor to the storage container may be set in a defined and simple manner by way of throttle valves or flow restrictors. However, throttle valves and flow restrictors are subject to certain wear. Moreover, variations in the supply of the precursor, for example in the case of variations of the pump output of the supply means, lead to variations in the level. By contrast, the overflow which is connected to a riser enables an established hydrostatic pressure to be set without variations in the level arising by way of dissimilar pump output, as long as the conveyed amount of precursor is larger than the retrieved amount of precursor. For example, it is conceivable for the riser to be of variable height such that the hydrostatic pressure may be set by way of the height of the overflow.

If and when, according to a further exemplary embodiment, separate recirculation lines, which optionally open into one or a plurality of collecting lines to the storage container, are provided for the excess precursor from each pick-off device to the storage container, the excess precursor during the coating procedure may be fed back to the storage container without any effect on the precursor level prevailing in the supply line.

According to a further embodiment of the coating device, the supply lines have one storage reservoir for each individual pick-off device. Supply interruptions which arise briefly may be equalized by the storage reservoir of each individual pick-off device, and a consistent layer thickness may be guaranteed.

Should the storage reservoirs of the pick-off devices be configured with an overflow, the excess precursor may be fed back in a simple manner by way of the overflow of the storage reservoir, for example. On the other hand, a storage reservoir may also be provided without an overflow such that the excess precursor that is directed from the pick-off device into the storage reservoir and may be re-used for coating.

According to a further embodiment of the coating device, at least one refill container which by way of a refill line and at least one refill valve is connected to the storage container is provided, so that the storage container may be refilled in a simple manner by way of the refill container.

Finally, according to a further embodiment of the coating device, means, for determining the filling level of the precursor in the storage container, and a controller by way of which the at least one refill valve for refilling the storage container is actuatable are provided. On account thereof, automatic filling of the storage container may be performed independently of the current production process.

According to a third teaching of the present invention, the object stated above is additionally achieved by the use of a coating device, in particular a plasma-coating device, for plasma coating piece goods, strips, metal strips, or steel strips, since the coating device, in particular the plasma-coating device, according to the invention enables a continuous and economical coating process for piece goods, strips, metal strips, or steel strips. In particular, the short setting-up times and the absence of production stoppages by virtue of refilling precursor media lead to significant advantages in the case of coating strips. Preferably, metal strips having bonding-agent layers for the production of composite panels composed of at least two metallic cover layers and at least one preferably thermoplastic plastics layer, disposed between the cover layers, are coated.

Firstly, FIG. 1 schematically shows a first exemplary embodiment of a device 1 for continuously supplying a precursor, according to the present invention. As part of a coating device, in particular of a plasma-coating device, the device 1 has a plurality of pick-off devices 2, 3 which serve for supplying coating modules (not illustrated here) for coating metal strips or piece goods (not illustrated here), for example. In the pick-off devices 2, 3 of the coating modules (not illustrated here), the precursor 6, by way of an inflowing process gas 2b, 3b, is retrieved from the supply line 2c, 3c of each pick-off device, is atomized, for example, and is supplied to a coating module (not illustrated). The precursor level P in the supply lines 2c, 3c, which are at least in regions configured as a riser, is decisive for the amount of precursor that is retrieved by the pick-off device 2, 3, depending on the parameters of the process gas 2b, 3b. The precursor level P in the supply lines 2c, 3c should therefore be kept as constant as possible.

The plurality of pick-off devices 2, 3 by way of the supply lines 2c, 3c and of the ring line 4 are connected to the storage container 5. The precursor 6 is pumped through the ring line 4 by a pump 7. The excess precursor by way of the ring line 4 is directed back into the storage container 5. The precursor 6, prior to flowing back into the storage container 5, when being fed back by way of the ring line 4, in the region of the recirculation is guided by means 8 for generating a hydrostatic pressure in each supply line of each one of the pick-off devices. The region of the recirculation for the precursor 6 commences as soon as the excess precursor has passed the last supply line of a pick-off device in the direction of the storage container 5.

In FIG. 1, an overflow 8 which is connected to a riser 8a is provided in the region of the recirculation as a means for providing a predetermined hydrostatic pressure in the ring line 4. The excess precursor rises in the riser 8a until said precursor 6 in the overflow 8 is able to flow off again in the direction of the storage container 5. A hydrostatic pressure in the precursor 6 in the upstream region of the ring line 4, in particular thus also in each supply line, is generated by the rising of the precursor 6 in the riser 8a. The hydrostatic pressure of the precursor in the ring line 4 between the pump 7 and the riser 8a is the result of the head of the riser 8a. Corresponding to the height of the riser 8a, a constant precursor level P is established in the supply lines 2c, 3c, so that a plurality of pick-off devices may be continuously supplied with the identical amount of precursor. The pick-off devices 2, 3 by virtue of the constant level P may continuously operate at a constant retrieved amount.

In the present exemplary embodiment, the unused precursor by way of separate recirculation lines 2d, 3d of each pick-off device 2, 3 is fed back to the storage container in a collecting line 9. Additionally, a refill container 10 which by way of a refill valve 11 and by way of a refill line 12 is connected to the storage container 5 is provided in FIG. 1. Means for detecting the maximum and the minimum filling level are indicated in the storage container 5. The maximum and the minimum filling level of the storage container may be used by way of a controller (5a) for controlling the refill valve 11. Refilling of the storage container 5 then is performed during operation, for example, without an interruption of the coating being necessary.

Figure 2:
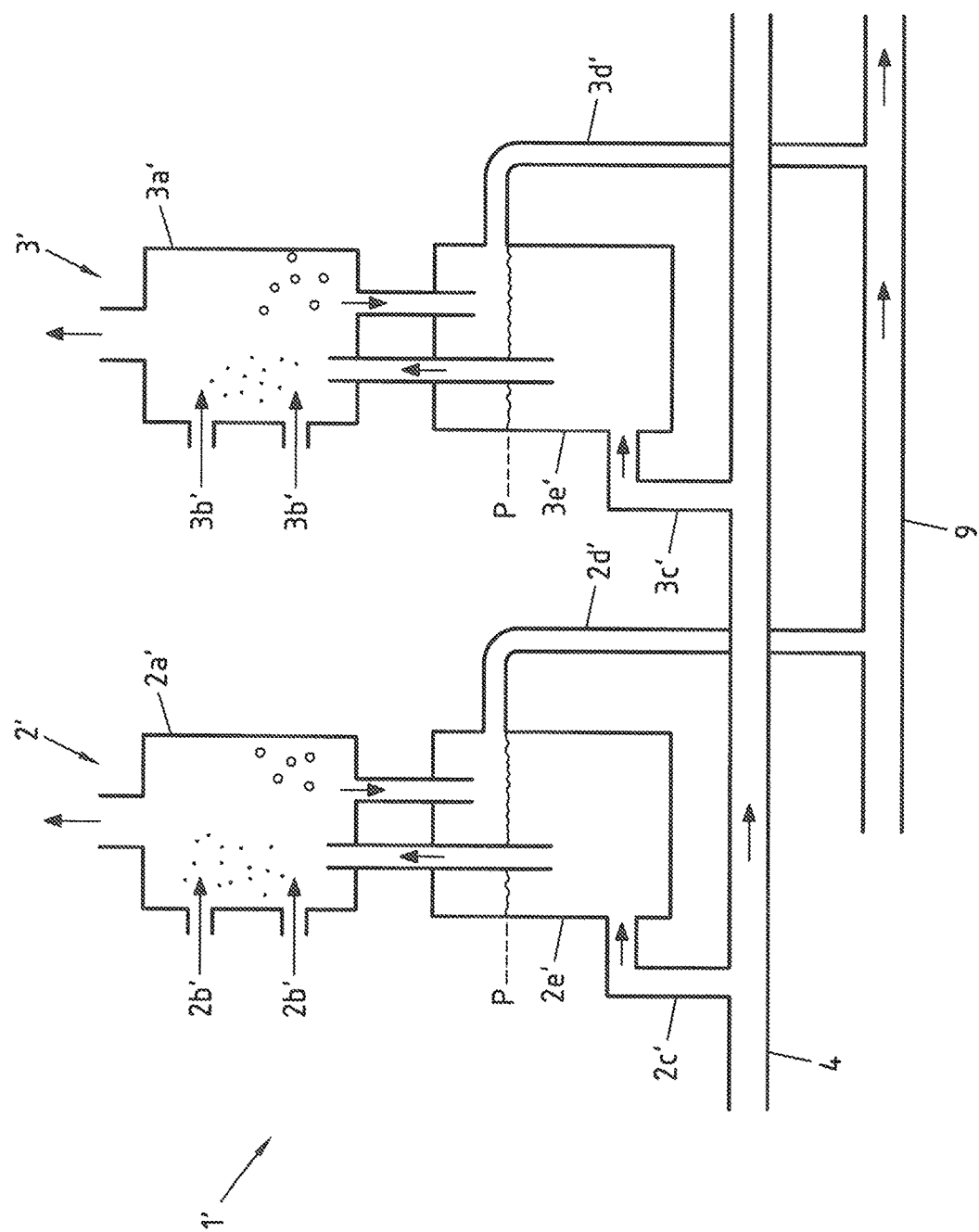
FIG. 2 is a schematic view of another example device.

FIG. 2 shows a further exemplary embodiment of a device 1' for continuously supplying a precursor, which has two pick-off devices 2', 3'. By contrast to the exemplary embodiment illustrated in FIG. 1, the supply lines 2c', 3c' which are connected to the ring line 4 here have storage reservoirs 2e', 3e' in which the precursor 6 assumes a specific level P, depending on the hydrostatic pressure in the ring line 4. The level P of the precursor in the storage reservoir 2e', 3e' of each pick-off device 2', 3' in the present exemplary embodiment depends in particular also on the position of the recirculation line, configured as an overflow, for the excess precursor 2d', 3d'. A maximum level P of precursor in the storage reservoir 2e', 3e' is provided by the overflow 2d', 3d'. Pressure variations in the ring line, by virtue of the storage reservoir, do not lead directly to varied coating results, since the precursor level P is varied only slightly. As part of a coating device (not illustrated), preferably a plasma-coating device, the device 1' thus enables a very constant coating process.

Figure 3:
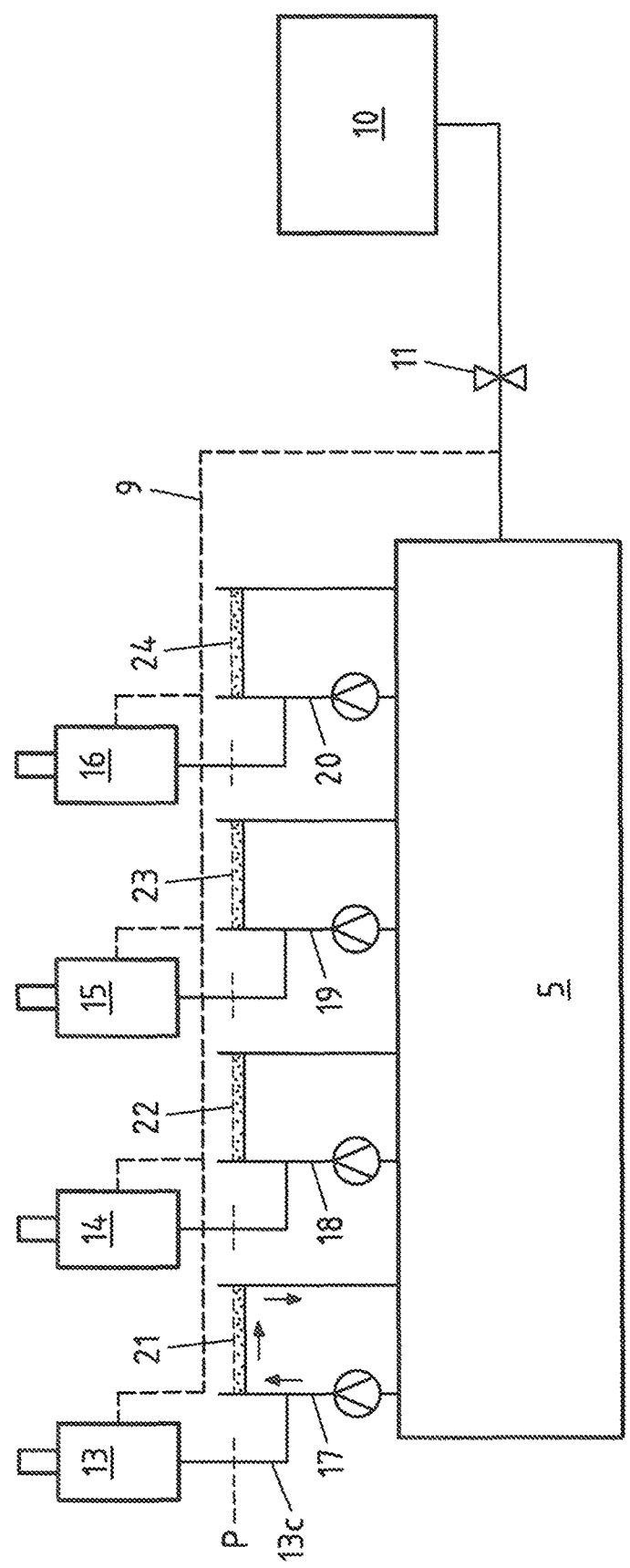
FIG. 3 is a schematic view of an example device having individual ring lines for each pick-off device.

In the exemplary embodiment illustrated in FIG. 3, each individual pick-off device 13, 14, 15, 16 has a dedicated ring line 17, 18, 19, 20, together with an associated overflow 21, 22, 23, 24 that is connected to a riser. Moreover, a pump 25, 26, 27, 28 which supplies the amount of precursor that flows through the ring line 17, 18, 19, 20 to the respective pick-off device is provided in each ring line. The amount of precursor supplied to each pick-off device is set so as to be higher than the amount of precursor consumed in the respective coating module (not illustrated). The excess precursor is fed back into the storage container 5 by way of a recirculation 9. Herein, a fixed predefined hydrostatic pressure is built up by the provided overflows 21, 22, 23, 24.

A refill container 10 which by way of a refill valve 11 is connected to the storage container 5 is also provided in FIG. 3. A common collecting line 9 which carries the excess precursor from the pick-off device into the storage container 5 is likewise provided. It is conceivable for a flow restrictor (not illustrated) or a throttle valve to be provided in place of the overflow that is connected to a riser. These means for generating a hydrostatic pressure in the ring lines 17, 18, 19, 20 also lead to a predefined precursor level in the supply lines.

What is claimed is:

1. A method for supplying a precursor to a plurality of coating modules of a coating device, wherein each of the plurality of coating modules includes a pick-off device and a supply line that is configured as a riser at least in some regions, wherein the precursor is supplied to the pick-off device by way of the supply line, the method comprising:
    supplying a precursor from a storage container by way of a ring line to a pick-off device, wherein an amount of the precursor that is supplied to the pick-off device exceeds an amount of the precursor that the pick-off device requires;
    feeding back into the storage container an excess amount of the precursor; and
    generating during recirculation of the precursor in the ring line a hydrostatic pressure in a supply line of the pick-off device that is connected to the ring line.

2. The method of claim 1 further comprising setting the hydrostatic pressure in the supply line of the pick-off device in the ring line during the recirculation of the precursor into the storage container, wherein the hydrostatic pressure is set by way of at least one of a throttle valve, a flow restrictor, or an overflow connected to a riser.

3. The method of claim 1 further comprising supplying the precursor to a plurality of supply lines of a plurality of pick-off devices.

4. The method of claim 1 further comprising:
    feeding with the ring line a storage reservoir that is connected to the pick-off device; and
    setting a level of the precursor in the storage reservoir by way of the hydrostatic pressure in the supply line.

5. The method of claim 1 wherein the excess amount of the precursor is fed back to the storage container in a collecting line that is separate from the supply of the precursor or in an individual line.

6. The method of claim 1 further comprising refilling the storage container when an amount of the precursor in the storage container reaches a minimum filling amount.

7. The method of claim 1 further comprising plasma coating at least one of piece goods, strips, metal strips, or steel strips with the plurality of coating modules of the coating device.

8. A coating device comprising:
    a plurality of coating modules, each coating module including a pick-off device and a supply line, the supply line being configured as a riser to the pick-off device at least in some regions, wherein the supply line is configured to supply a precursor to the pick-off device;
    a storage container for the precursor, wherein the pick-off devices are connected to the storage container either collectively by way of a common ring line or individually by way of separate ring lines for purposes of recirculating excess precursor;
    means for supplying the precursor by way of the common ring line or the separate ring lines to the pick-off devices; and
    means for generating a hydrostatic pressure in the supply lines of the plurality of coating modules, the means for generating hydrostatic pressure being disposed in the common ring line or the separate ring lines in a region where the precursor is recirculated into the storage container.

9. The coating device of claim 8 comprising the separate ring lines for purposes of recirculating excess precursor from each pick-off device to the storage container.

10. The coating device of claim 9 wherein the separate ring lines open into one or more collecting lines to the storage container.

11. The coating device of claim 8 wherein each supply line includes a storage reservoir for each pick-off device.

12. The coating device of claim 11 wherein the storage reservoirs of the pick-off devices include an overflow.

13. The coating device of claim 8 further comprising a refill container that connects the storage container to a refill line and a refill valve.

14. The coating device of claim 13 further comprising:
    means for determining a filling level of the precursor in the storage container; and
    a controller for actuating the refill valve to refill the storage container.

* * * * *